(12) United States Patent
Vaufrey et al.

(10) Patent No.: US 8,410,684 B2
(45) Date of Patent: Apr. 2, 2013

(54) ELECTRONIC DISPLAY DEVICE HAVING AN AUXILIARY ELECTRODE IN EACH PIXEL REGION TO MAXIMIZE EMISSION AREA AND ITS FABRICATION PROCESS

(75) Inventors: David Vaufrey, Grenoble (FR); Thierry Flahaut, Cholonge (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 236 days.

(21) Appl. No.: 12/949,912

(22) Filed: Nov. 19, 2010

(65) Prior Publication Data

US 2011/0121718 A1    May 26, 2011

(30) Foreign Application Priority Data

Nov. 24, 2009   (FR) ...................................... 09 05631

(51) Int. Cl.
 *H01J 1/62* (2006.01)
 *H01J 9/00* (2006.01)
(52) U.S. Cl. .......... 313/504; 313/506; 313/507; 445/24; 445/25; 315/169.1; 315/169.3
(58) Field of Classification Search ............... 445/24–25
 See application file for complete search history.

(56) References Cited

U.S. PATENT DOCUMENTS

| 7,535,164 | B2 * | 5/2009 | Nakajima et al. | ............. 313/504 |
| 2003/0116772 | A1 | 6/2003 | Yamazaki et al. | |
| 2003/0201716 | A1 | 10/2003 | Yamazaki et al. | |
| 2005/0233159 | A1 * | 10/2005 | Fartash | ......................... 428/457 |
| 2007/0018150 | A1 | 1/2007 | Nakajima et al. | |

OTHER PUBLICATIONS

Search Report for French Application No. FR 09 05631, dated Jul. 16, 2010.

* cited by examiner

*Primary Examiner* — Tracie Y Green
(74) *Attorney, Agent, or Firm* — Alston & Bird, LLP

(57) ABSTRACT

The invention relates to an electronic display device having an electroluminescent screen and to its manufacturing method. This device includes a substrate (2) coated with a matrix of pixels, each pixel formed by an organic emitting structure (5) intermediate between two electrodes, one (3) near and the other (4) far, relative to the substrate respectively, an electrically insulating resin (7) covering the substrate between the respective near electrodes of the pixels and furthermore extending onto a peripheral edge (3a) of each near electrode. Each pixel incorporates at least one auxiliary electrode (8) having a work function identical or substantially identical to that of the near electrode, and which extends inclinedly on the surface of the resin and facing said edge, from the near electrode towards the far electrode, so as to maximize the emission area of each pixel.

19 Claims, 2 Drawing Sheets

ELECTRONIC DISPLAY DEVICE HAVING AN AUXILIARY ELECTRODE IN EACH PIXEL REGION TO MAXIMIZE EMISSION AREA AND ITS FABRICATION PROCESS

FIELD OF THE INVENTION

The present invention relates to a monochromatic or polychromatic electronic display device having an electroluminescent screen and to its fabrication process. The invention applies in particular to active matrix microscreen or microdisplays surmounted by organic light-emitting diodes (OLEDs).

BACKGROUND OF THE INVENTION

In a known way, electroluminescent display devices comprise an emission region formed from a matrix of pixels, each pixel typically consisting of a plurality of differently coloured (RGB: red, green and blue, in general) subpixels, and from an electrical connection region arranged to lie adjacent this emission region. Production of such microdisplay or microscreen devices, i.e. having pixels with side lengths of less than 50 µm, gives rise to many technical problems due to this targeted small pixel size and in particular to the use of OLED technology which, for each pixel, uses a light-emitting multilayer structure comprising an organic film intermediate between two, internal and external, electrodes that serve as anode and cathode, one of which is transparent or semitransparent to the emitted light whereas the other is generally reflective. For a description of such an OLED microdisplay, for example, mention may be made of document EP-A2-2 065 949 in the name of the Applicant.

In fact, OLEDs based on small molecules cannot be microstructured with conventional microelectronic technologies and it is therefore impossible for three separate emitting structures, emitting in the red, the green and the blue respectively, to be spatially deposited on one and the same internal base electrode so as to form the three subpixels of each pixel. The small pixel size requires that a white-light emitter be vacuum evaporated and then optically filtered, the subpixels being distinguished from one another by the internal base electrodes on which they are respectively deposited.

These base electrodes are generally separated from one another by an electrically insulating resin that covers the substrate, and very often, after a step in which the last metallization level corresponding to each base electrode is etched, a lithography step is carried out which softens the topography of the substrate thus covered but also allows the opening of each subpixel to be defined relative to the resin that partially covers the periphery of its base electrode.

This lithography step proves to be essential because the OLED layers are very thin and consequently very sensitive to breaks in slope (all the more so because the aforementioned vacuum evaporation is not a conformal deposition method).

However, one major drawback of this lithography is that the aperture of each subpixel (which increases as the coverage of the base electrode by the resin decreases) must be written in the unetched metal surface of this base electrode. This results in the effective area of the diode and, consequently, the aperture ratio of the display device (which is defined as the ratio of the actual emissive area of the display to its total area) being proportionally reduced.

It is for this reason that it is desired, at the present time, to increase as much as possible the aperture ratio of displays, whether polychromatic (i.e. defined by these subpixels) or monochromatic (i.e. only defined by pixels, there being no subpixels), using OLED technology because for a given luminance (expressed in $cd/m^2$) of the pixels or subpixels the greater the aperture ratio, the lower the current density flowing through them and therefore the longer the lifetime of the display. This maximizing of the aperture ratio is particularly desired for microdisplays because, on the one hand, of their aforementioned small pixel size, and, on the other hand, of the use of colour filters which absorb a non-negligible part of the emitted luminous flux.

SUMMARY OF THE INVENTION

One object of the present invention is to provide a monochromatic or polychromatic electronic display device that allows this need to be met and which thus alleviates the aforementioned drawback, this device comprising an electroluminescent emission face and, towards the interior of this face, a substrate coated with a matrix of pixels, each pixel consisting of an organic light-emitting structure intermediate between and in electrical contact with two electrodes, one near and the other far relative to the substrate respectively, an electrically insulating resin covering the substrate between the respective near electrodes of the pixels and furthermore extending onto a peripheral edge of each near electrode.

For this purpose, a device according to the invention is such that each pixel incorporates at least one auxiliary electrode which is transparent or semitransparent to this light, which is based on a metallic material having a work function identical or substantially identical to that of the near electrode and which extends inclinedly on the surface of this resin and facing said edge, from the near electrode towards the far electrode, so as to maximize the emission area of each pixel and to vary the thickness of the optical cavity formed between the near electrode of each pixel and the far electrode.

Advantageously this device may be a polychromatic device, each pixel in this case consisting of differently coloured subpixels that are formed by said emitting structure intermediate between said near electrodes respectively associated with these subpixels and said far electrode, at least one subpixel of each pixel incorporating in this case said at least one auxiliary electrode.

The expression "near electrode" should be understood to mean, in the present description, the base electrode (i.e. internal electrode or last metallization level) which is associated with each pixel or subpixel in the case of a monochromatic or polychromatic device, respectively. The expression "far electrode" should be understood to mean the top electrode (i.e. external electrode) that covers the organic light-emitting structure.

It is pointed out that each auxiliary electrode according to the invention, which thus extends from the base electrode of a pixel or subpixel prolonging it towards the exterior (i.e. towards the far electrode) in the manner of a ramp, allows the emissive area of this pixel or subpixel to be increased relative to that of a known pixel or subpixel, the aperture of which is delimited only by the resin, because the planar electrical conduction of this auxiliary electrode is greater than the transverse conduction of the organic layers of the emitting structure that surmounts it. The peripheral width of each auxiliary electrode, which may for example vary from a few tenths of a micron to a few microns, thus provides the corresponding pixel or subpixel with a light-emitting peripheral edge in addition to, and comparable to, the central part of the pixel or subpixel defined by the region of the near electrode not covered by the resin. This results in an increase in the actual light-emitting area of all the pixels of the display device and therefore in an aperture ratio that may be substantially higher for the latter device relative to that of the aforementioned known devices, which leads to a minimized current density for a given luminance and therefore an extended lifetime of the device according to the invention.

It is also pointed out that each auxiliary electrode is based on a metal having an identical or substantially identical work function to that of the near electrode, so that this auxiliary electrode does not form an auxiliary diode that would operate in parallel with the main diode corresponding to the uncovered near electrode, the impedance of which would be substantially different from the impedance of this main diode. Indeed, such impedance differences generated in parallel for each pixel or subpixel would induce current to flow mainly in the diode of lower impedance, with the undesirable result that only the main diode or only the auxiliary diode would actually emit light (i.e. either the peripheral edge or the central part, respectively, of the pixel or subpixel, would be excluded).

Preferably, each auxiliary electrode has a thickness of between 1 nm and 10 nm and is made of a metallic material identical to that of the corresponding electrode.

Even more preferably, the metallic material of the near electrode and of the auxiliary electrode consists of a single chemical element, preferably chosen from the group consisting of titanium, molybdenum, tungsten, chromium, nickel, copper and gold.

As a variant, this metallic material of the near electrode and of the auxiliary electrode may consist of a chemical compound chosen from the group consisting of transparent conductive oxides such as indium tin oxide, conductive metal oxides having the formula $M_xO_y$, where M is a metal such as titanium, molybdenum or tungsten, and conductive metal nitrides having the formula $M'_xN_y$, where M' is a metal such as titanium.

It is furthermore pointed out that each auxiliary electrode which is formed on the surface of the resin, by being transparent or semitransparent (especially in the visible range), allows the thickness of the optical cavity of the corresponding pixel or subpixel to be spatially varied, which cavity is formed by the two, near and far, electrodes, it being clarified that this thickness may be modulated by the local topology of the underlying resin. The result of this spatial variation in the thickness of the optical cavity is an advantageous variation in the spectral response of the latter, as will be explained below.

It should be pointed out that each auxiliary electrode has the advantage, because it is transparent or semitransparent and also because it marries precisely the gently sloping profile of the resin, of not altering the operation of this optical cavity, especially for filtered broad-spectrum white light-emitting structures.

According to another feature of the invention, in each pixel or in said at least one subpixel of each pixel (i.e. in the case of a monochromatic or polychromatic device, respectively), the auxiliary electrode may extend obliquely, in the manner of a continuous peripheral ramp, facing the entire perimeter of said edge covered by the resin, having a height measured from this edge that increases monotonically.

This monotonic increasing variation (i.e. exclusively towards the far electrode) of each auxiliary electrode allows the wavelengths of the subpixels to be amplified in turn and allows the light spectrum emitted by all the pixels of the device to be broadened.

Advantageously, each of the subpixels of each pixel may incorporate said auxiliary electrode that then extends preferably facing the entire perimeter of said peripheral edge covered by the resin. In addition, said emitting structure and said far electrode follow the inclined profile of each auxiliary electrode.

According to another feature of the invention, this device according to the invention forms a microdisplay having an active-matrix substrate with the emitting structures forming organic light-emitting diodes (OLEDs), the pixels having side lengths of less than 50 μm and the subpixels being respectively surmounted by optical colour filters (for example secured to the internal surface of a transparent protective cover, made of glass or plastic, which is bonded to the screen).

A process for fabricating, according to the invention, a display device such as that defined hereinabove comprises at least one dry-etching step carried out on the substrate surmounted by said near electrodes and by the resin that connects them together at their respective peripheral edges, this dry-etching being carried out using the mechanical action of a plasma that is chemically inert with respect to each near electrode and that extracts from it a part of the material not covered by the resin so as to implant it by ricochet onto an adjacent portion of this resin surmounting this edge, so that each auxiliary electrode thus implanted prolongs the near electrode inclinedly, from which it originates, preferably over the entire perimeter of this near electrode.

Advantageously, a plasma of at least one element chosen from the last column of the Periodic Table, such as an argon plasma, is used for this dry-etching step.

Preferably, a metallic material consisting of a single chemical element, preferably chosen from the group consisting of titanium, molybdenum, tungsten, chromium, nickel, copper and gold, is used for each near electrode, so that each auxiliary electrode (8) thus implanted consists of this same material following the mechanical action of this plasma.

As a variant, a metallic material consisting of a chemical compound as defined hereinabove may be used for each near electrode and, after the mechanical action of this plasma, each as-yet incomplete auxiliary electrode is subjected to a finishing plasma such as an $O_2$ or $N_2/NH_3$ plasma, if the near electrode is made of an oxide or a metal nitride respectively, so that each auxiliary electrode thus implanted consists of the same material as the near electrode from which it originates.

BRIEF DESCRIPTION OF THE DRAWINGS

Other advantages, features and details of the invention will become clear from the following description and the referenced, appended drawings, given merely by way of example, in which.

DETAILED DESCRIPTION

Figure 1:
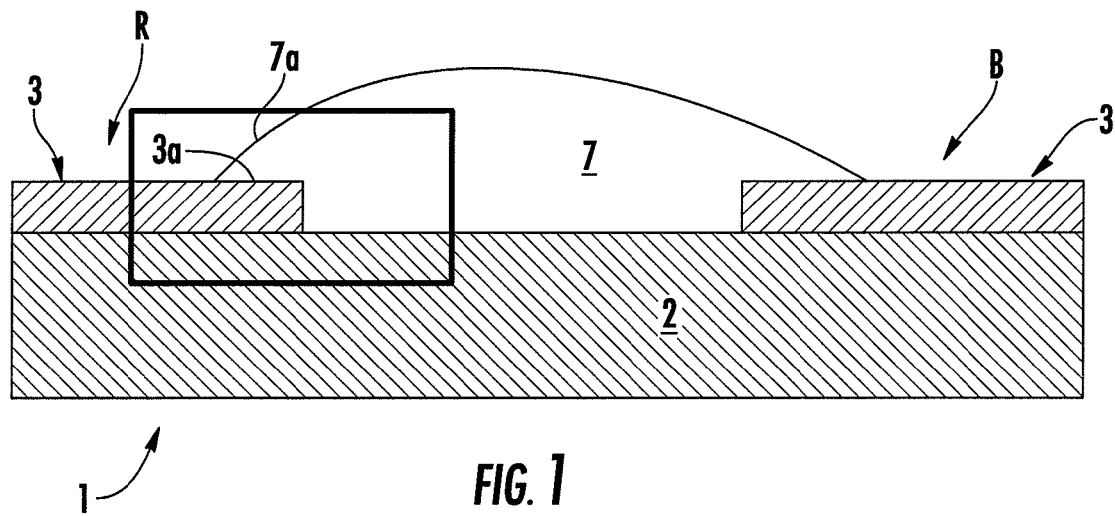
FIG. 1 is a schematic, partial, cross-sectional view of a microdisplay according to the invention, during fabrication, showing an insulating resin partially covering the respective base electrodes of two adjacent subpixels.
Figure 2:
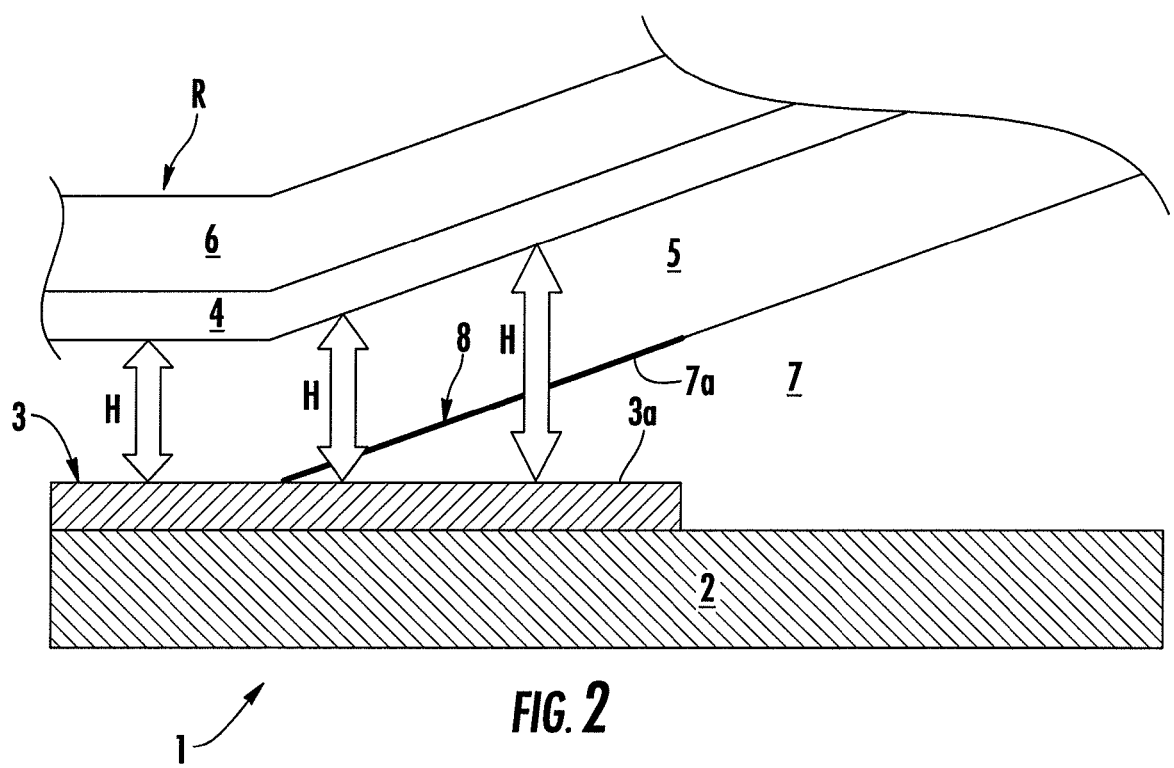
FIG. 2 is a schematic, partial, cross-sectional view showing, at a larger scale, the framed region of FIG. 1 with the implantation onto the resin of an auxiliary electrode originating from a base electrode followed by deposition of the emissive structure, of the external electrode and of a layer for covering the microdisplay.

The following description of the invention given with reference to FIGS. 1 and 2 relates to a polychromatic microdisplay but it will be noted that it could equally apply to a monochromatic microdisplay on condition that the subpixels be replaced with pixels.

The polychromatic microdisplay 1 according to the invention during fabrication, schematized in FIGS. 1 and 2, is an OLED microdisplay and it comprises a substrate 2, for example made of silicon, coated with an active matrix of pixels, two adjacent subpixels, or colour dots, R and B of which are identified in FIG. 1, for each pixel, by their near base electrode 3, i.e. near relative to the substrate 2, which base electrode is chosen to be transparent or semitransparent and that plays the role, for example, of an anode. This array of base electrodes 3, defining the set of subpixels R, G, B of each pixel, surmounts, in a known way, an integrated circuit structure of the substrate 2 that serves to address each pixel and that may comprise, for example for each pixel, two transistors and a capacitor, or more complicated circuits.

The matrix of pixels of the microdisplay 1 is connected to an electrical connection region (not illustrated) for establishing a potential difference between each base electrode 3 and an external electrode 4 forming, for example, the cathode, which electrode is far relative to the substrate 2 and in contact with an intermediate single-layer or multilayer organic light-emitting structure 5 (this structure 5 may be seen in FIG. 2). This organic film intermediate between the electrodes 3 and 4 is designed to transfer the electrons and holes which stem from these electrodes 3 and 4 and which recombine to generate excitons and therefore light emission. In the example of FIG. 2, a dielectric covering layer 6 transparent to the light emitted may furthermore be seen, this layer being deposited on the external electrode 4.

Before the emitting structure 5 is deposited on the base electrodes 3, an electrically insulating resin 7 is deposited, also in a known way, on the substrate 2 (this resin 7 being chosen to be compatible with the organic materials used to produce the diodes), in such a way that the resin 7 deposited connects all the electrodes 3 together, partially covering their respective peripheral edges 3a.

According to the invention, a dry-etching step is then used to etch all of the base electrodes 3 and the resin 7 by the mechanical action of a plasma, chosen to be chemically inert relative to the metallic material of these electrodes 3, so as to extract from each electrode 3 a part of this material not covered by the resin 7 (i.e. "open") so as to implant it by ricochet onto the peripheral portion 7a immediately adjacent this resin 7 (which resin surmounts the peripheral edge 3a of each electrode 3). As may be seen in FIG. 2, after a certain period of dry etching an auxiliary electrode 8 is obtained, which electrode is formed on the surface of the peripheral portion 7a of the resin 7 prolonging obliquely, with an increasing height H, the base electrode 3 from which it originated, over the entire circumference of the latter (i.e. facing its peripheral edge 3a).

The implantation depth or thickness of this auxiliary electrode 8 is, for example, between 1 nm and 5 nm, it being clarified that this depth is a function of the time spent etching. As for the width (measured from the electrode 3) of the electrode 8, this especially depends on the etching power used and may vary somewhat relative to the schematic of FIG. 2.

This dry-etching of each electrode 3 thus creates a thin, transparent or semitransparent, electrode 8 which is conducting (comparably to this electrode 3) and which allows the area of each subpixel R, G, B, by virtue of its planar conduction of electricity, to be increased, therefore increasing the overall aperture ratio of the microdisplay 1 relative to an analogous known microdisplay devoid of such auxiliary electrodes 8 and, thereby, for a given luminance, the necessary current density is reduced and therefore the lifetime of the microdisplay 1 is extended.

As explained above, a single chemical element such as titanium, molybdenum, tungsten, chromatic, nickel, copper or gold is preferred as the metallic material of each base electrode 3 so that the auxiliary electrode 8 etched onto the resin 7 by the mechanical action of the plasma consists strictly of the same material as the base electrode 3 from which it originated.

If a compound metallic material (i.e. a binary or tertiary compound, e.g. indium tin oxide, a metal oxide $M_xO_y$, where M is a metal such as titanium, molybdenum or tungsten, or a metal nitride $M_x'N_y'$, where M' is a metal such as titanium) is chosen for each base electrode 3, then the material, implanted physically on the surface 7a of the resin 7, is treated using an $O_2$ finishing plasma, which oxidizes the metal atoms implanted, if this material is a metal oxide, or an $N_2/NH_3$ finishing plasma if a metal nitride is concerned, so that each auxiliary electrode 8 implanted finally consists of the same material as the electrode 3 from which it is derived.

Because the physical dry-etching breaks chemical bonds inside such a compound material electrode 3, only a nonvolatile single chemical element is actually implanted on the resin 7 (in fact, the oxygen or nitrogen, depending on the case, remains in a gaseous form and is therefore removed by the pump of the equipment used for the dry etch). As it is very unlikely that such an implanted single element will have the same work function as this oxide or nitride compound material, without this finishing plasma two diodes having different impedances would be formed in parallel (one in the "open" portion of each electrode 3 and the other in the auxiliary electrode 8 surrounding it) and consequently the current would almost all flow through the diode of lower impedance and therefore only the central "open" portion or only the covered peripheral portion of each subpixel R, G, B would be actually emissive, something that it is of course desirable to avoid.

Figure 3:
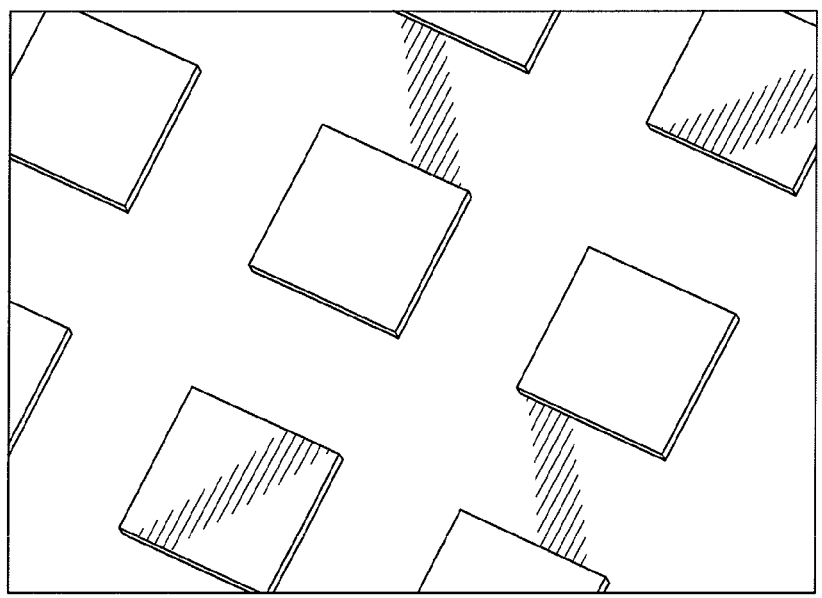
FIG. 3 is a photograph showing the external emission surface of a microdisplay, the subpixels of which incorporate an auxiliary electrode according to FIG. 2 but made of a material not according to the invention.

The photograph in FIG. 3 illustrates just such peripheral light emission, for each subpixel R, G, B, only from each auxiliary electrode 8 made of Ti (see the light border surrounding each dark square), which electrode is implanted by an argon plasma having the reference "TELR P003 PM" from a base electrode 3 made of TiN, generating a diode in parallel having a lower impedance than that of the "open" portion of the electrode 3. It will be noted that it would be enough to complete this dry etch using the aforementioned $N_2/NH_3$ finishing plasma to make this "open" portion emissive, comparably to its border. By way of indication, with reference to the example of FIG. 3, each dark square defining this "open" portion of a subpixel R, G, B has an area of 2.5 µm×2.5 µm, i.e. 6.25 µm², and as the emissive peripheral portion of each electrode 8 has in this example a width of 0.15 µm, by virtue of the electrodes 8 of the invention an increase in area of each subpixel of 0.15×2.5×4=1.5 µm² is obtained, that is an area increase per subpixel of about 20%.

Figure 4:
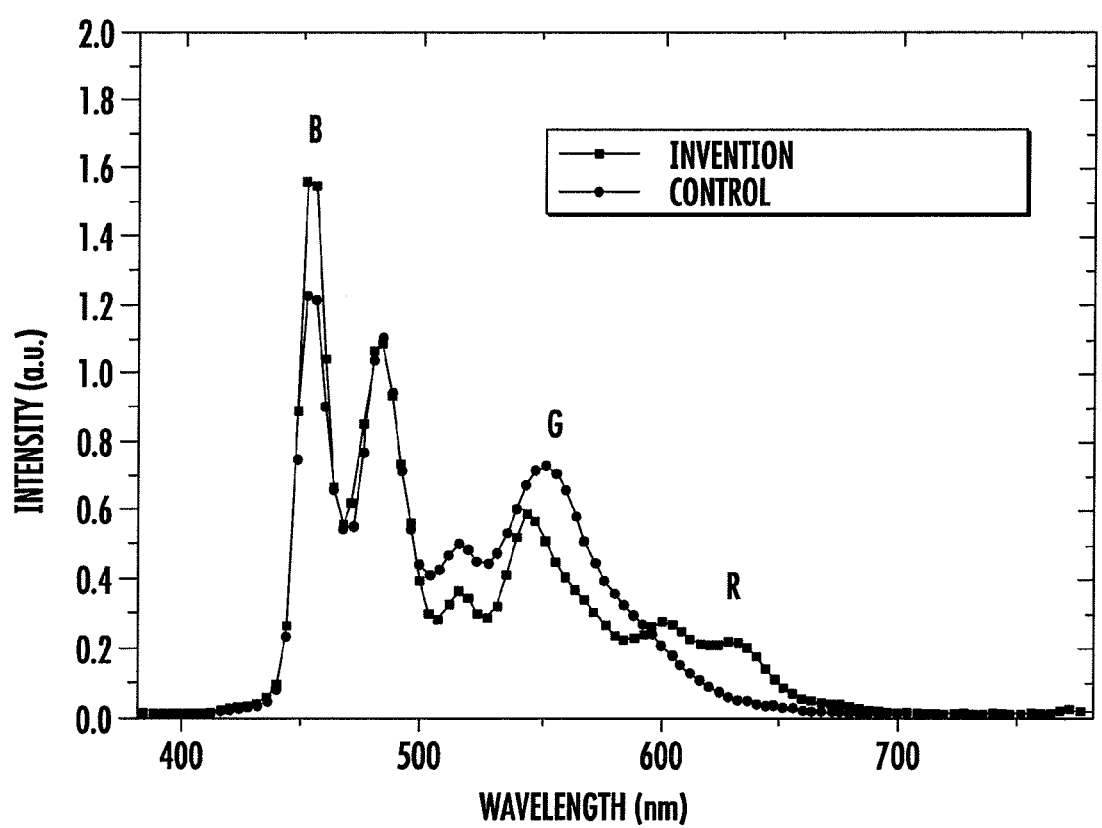
FIG. 4 is a graph showing the emission spectra (in a.u.) as a function of the wavelength (in nm) of the light emitted in the visible range by a diode according to the invention and by a "control" diode devoid of any auxiliary electrode.

Another advantage of the transparent or semitransparent auxiliary electrodes 8 according to the invention is illustrated in FIG. 4, which shows that the variation in thickness of the optical cavity obtained via the electrode 8, for this OLED diode according to the invention, between the base electrode 3 and the external electrode 4, allows the wavelengths emitted in the blue, the green and then in the red to be successively amplified, and it also broadens the total emission spectrum of this diode.

Indeed, it is seen in the graph of FIG. 4 that the electrode 8 implanted, by dry-etching by means of the same aforementioned argon plasma, on the periphery of the electrode 3 confers on the "invention" curve (interconnected square points), compared to the "control" curve (interconnected circular points):

- a peak in the deepest blue (towards 450 nm) having a clearly higher luminous intensity; and at the same time
- a broadening of the total spectrum of the diode towards 650 nm (this spectrum illustrated corresponding to the sum of the two spectra associated with the "open" and covered portions of the base electrode 3).

Moreover, the colour coordinates of this "control" diode, devoid of auxiliary electrode 8, and of this diode according to the invention, incorporating it by the aforementioned dry etch, were measured after optical filters colour were used. For each of the two diodes, "control" and according to the invention, three y=f(x) "CIE 1931" chromaticity diagrams in the form of colour triangles were established after red, green and blue filters had been fitted, which showed that the red and the blue were deeper, after using these colour filters, for the diode according to the invention and therefore that the colour triangle obtained by virtue of the auxiliary electrode 8 was more extended.

The invention claimed is:

1. Electronic display device comprising an electroluminescent emission face and, towards the interior of this face, a substrate coated with a matrix of pixels, each pixel consisting of an organic light-emitting structure intermediate between and in electrical contact with two electrodes, one near and the other far relative to the substrate respectively, an electrically insulating resin covering the substrate between the respective near electrodes of the pixels and furthermore extending onto a peripheral edge of each near electrode, each pixel incorporates at least one auxiliary electrode which is transparent or semitransparent to this light, which is based on a metallic material having a work function identical or substantially identical to that of the near electrode and which extends inclinedly on the surface of this resin and facing said edge, from the near electrode towards the far electrode, so as to maximize the emission area of each pixel and to vary the thickness of the optical cavity formed between the near electrode of each pixel and the far electrode.

2. The device according to claim 1, characterized in that, in each pixel, said auxiliary electrode extends obliquely facing the entire perimeter of said peripheral edge covered by said resin and has a height (H) measured from this edge that is a monotonic increasing function of the width of said edge.

3. The device according to claim 1, characterized in that each auxiliary electrode has a thickness of between 1 nm and 10 nm and is made from a metallic material identical to that of said corresponding near electrode.

4. The device according to claim 3, characterized in that the metallic material of each near electrode and of said corresponding auxiliary electrode consists of a chemical element selected from the group consisting of titanium, molybdenum, tungsten, chromium, nickel, copper and gold.

5. The device according to claim 3, characterized in that the metallic material of each near electrode and of said corresponding auxiliary electrode consists of a chemical compound selected from the group consisting transparent conductive oxides, conductive metal oxides having the formula $M_xO_y$, where M is a metal, and conductive metal nitrides having the formula $M'_xN_y$, where M' is a metal.

6. The device according to claim 3, wherein that the metallic material of each near electrode and of said corresponding auxiliary electrode is a transparent conductive oxide comprising indium tin oxide.

7. The device according to claim 3, wherein that the metallic material of each near electrode and of said corresponding auxiliary electrode is a conductive metal oxides having the formula $M_xO_y$, where M is titanium, molybdenum or tungsten.

8. The device according to claim 3, wherein that the metallic material of each near electrode and of said corresponding auxiliary electrode is a conductive metal nitrides having the formula $M'_xN_y$, where M' is titanium.

9. The device according claim 1, said device being a polychromatic device, characterized in that each pixel consists of differently coloured subpixels (R, G, B) that are formed by said organic emitting structure intermediate between and in electrical contact with said near electrodes associated respectively with these subpixels and said far electrode, at least one subpixel of each pixel incorporating said at least one auxiliary electrode.

10. The device according to claim 9, characterized in that each subpixel (R, G, B) of each pixel incorporates said auxiliary electrode that extends facing the entire perimeter of said peripheral edge covered by said resin and in that said emitting structure and said far electrode follow the inclined profile of each auxiliary electrode.

11. The device according to claim 10, characterized in that it forms a microdisplay the pixels of which have a side length of less than 50 μm and have their subpixels (R, G, B) respectively surmounted by optical colour filters, said substrate being an active-matrix substrate with said emitting structures that form organic light-emitting diodes (OLEDs).

12. A process for the fabrication of a display device according to claim 1, comprising at least one dry-etching step carried out on the substrate surmounted by said near electrodes and by the resin that connects them together at their respective peripheral edges, said dry-etching step being carried out using the mechanical action of a plasma that is chemically inert with respect to each near electrode and that extracts from it a part of the material not covered by the resin so as to implant it by ricochet onto an adjacent portion of this resin surmounting this edge, so that each auxiliary electrode thus implanted prolongs the near electrode inclinedly, from which it originates over the entire perimeter of this near electrode.

13. Fabrication process according to claim 12, characterized in that a plasma of at least one element chosen from the last column of the Periodic Table is used for this dry-etching step.

14. Fabrication process according to claim 12, characterized in that a plasma of at least one element is an argon plasma used for this dry-etching step.

15. Fabrication process according to claim 12, characterized in that a metallic material is selected from the group consisting of titanium, molybdenum, tungsten, chromium, nickel, copper and gold, and is used for each near electrode so that each auxiliary electrode thus implanted consists of this same material following the mechanical action of this plasma.

16. Fabrication process according to claim 12, characterized in that a metallic material consisting of a chemical compound chosen from the group consisting of transparent conductive oxides, conductive metal oxides having the formula $M_xO_y$, where M is a metal, and conductive metal nitrides having the formula $M'_xN_y$, where M' is a metal, is used for each near electrode and in that, after the mechanical action of this plasma, the as-yet incomplete auxiliary electrode is subjected to a finishing plasma such as an $O_2$ or $N_2/NH_3$ plasma, if the near electrode is made of an oxide or a metal nitride respectively, so that each auxiliary electrode thus implanted consists of the same material as the near electrode from which it originates.

17. Fabrication process according to claim 16, wherein the transparent conductive oxide comprises indium tin oxide.

18. Fabrication process according to claim 16, wherein the conductive metal oxide has the formula $M_xO_y$, and wherein M is titanium, molybdenum or tungsten.

19. Fabrication process according to claim 16, wherein the conductive metal nitride has the formula $M'_xN_y$, and wherein M' is titanium.

\* \* \* \* \*

UNITED STATES PATENT AND TRADEMARK OFFICE
CERTIFICATE OF CORRECTION

| | |
|---|---|
| PATENT NO. | : 8,410,684 B2 |
| APPLICATION NO. | : 12/949912 |
| DATED | : April 2, 2013 |
| INVENTOR(S) | : Vaufrey et al. |

It is certified that error appears in the above-identified patent and that said Letters Patent is hereby corrected as shown below:

In the Claims:

Column 8,
Line 3, "oxides" should read --oxide--;
Line 8, "nitrides" should read --nitride--.

Signed and Sealed this
Thirteenth Day of August, 2013

Teresa Stanek Rea
*Acting Director of the United States Patent and Trademark Office*